US007355536B2

(12) United States Patent
Dempsey et al.

(10) Patent No.: US 7,355,536 B2
(45) Date of Patent: Apr. 8, 2008

(54) SYSTEM AND METHOD FOR DIGITAL COMPENSATION OF DIGITAL TO ANALOG AND ANALOG TO DIGITAL CONVERTERS

(75) Inventors: Dennis A. Dempsey, Crecora (IE);
Thomas G. O'Dwyer, Clonlara (IE);
Oliver James Brennan, Adare (IE);
Alan Walsh, Tullamore (IE); Tudor Vinereanu, Cork (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/528,682

(22) PCT Filed: Sep. 24, 2003

(86) PCT No.: PCT/IE03/00129

§ 371 (c)(1),
(2), (4) Date: Jan. 27, 2006

(87) PCT Pub. No.: WO2004/030219

PCT Pub. Date: Apr. 8, 2004

(65) Prior Publication Data

US 2006/0125669 A1 Jun. 15, 2006

Related U.S. Application Data

(60) Provisional application No. 60/414,166, filed on Sep. 27, 2002.

(51) Int. Cl.
*H03M 1/10* (2006.01)
*H03M 1/06* (2006.01)
*H03M 1/66* (2006.01)

(52) U.S. Cl. .................... 341/120; 341/144
(58) Field of Classification Search ............... 341/118, 341/119, 120
See application file for complete search history.

(56) References Cited

U.S. PATENT DOCUMENTS

| 4,419,656 | A | * | 12/1983 | Sloane | 341/120 |
|---|---|---|---|---|---|
| 4,829,236 | A | * | 5/1989 | Brenardi et al. | 324/74 |
| 5,594,612 | A | * | 1/1997 | Henrion | 341/120 |
| 5,818,370 | A | * | 10/1998 | Sooch et al. | 341/120 |
| 6,191,715 | B1 | * | 2/2001 | Fowers | 341/120 |
| 6,351,228 | B1 | * | 2/2002 | Kutsuno et al. | 341/120 |
| 6,463,093 | B1 | * | 10/2002 | Komara et al. | 375/220 |
| 6,570,514 | B1 | * | 5/2003 | Velazquez | 341/118 |

FOREIGN PATENT DOCUMENTS

| EP | 1061652 | 12/2000 |
|---|---|---|
| WO | WO 0201739 | 1/2002 |

* cited by examiner

*Primary Examiner*—Howard Williams
(74) *Attorney, Agent, or Firm*—Iandiorio, Teska & Coleman

(57) ABSTRACT

The present invention relates to a system and method for digitally compensating signal converters and in particular a digital to analog converter which receives digital input data for a digital to analog converter and supplies anti-function digital coefficients derived from the error function of the digital to analog converter and corresponding to the digital input data and applies the anti-function digital coefficients to the digital input data to pre-condition the digital input data to compensate for the error function of the digital to analog converter. The invention also extends to analog to digital converters.

36 Claims, 9 Drawing Sheets

CORRECTION MODE

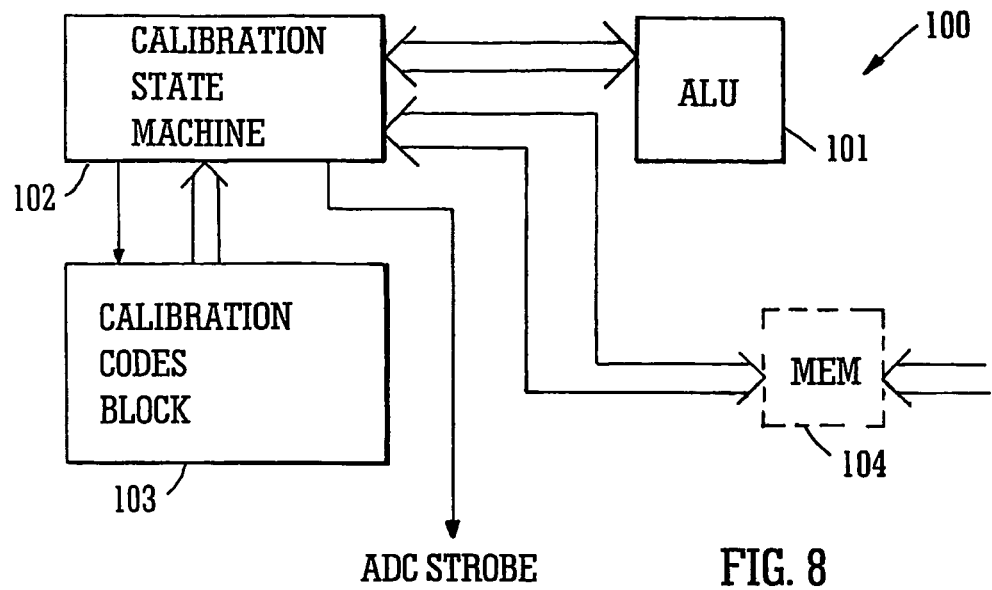
ADC STROBE    FIG. 8
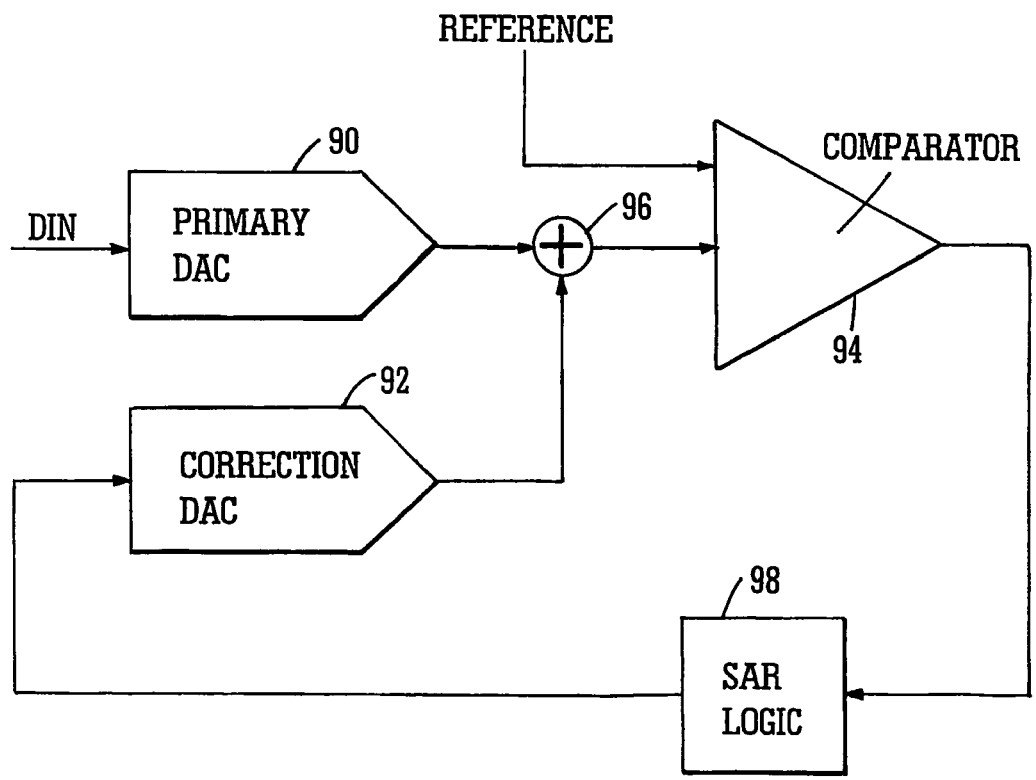
FIG. 9
(PRIOR ART)

SYSTEM AND METHOD FOR DIGITAL COMPENSATION OF DIGITAL TO ANALOG AND ANALOG TO DIGITAL CONVERTERS

CONTINUING DATA

This application is a 371 of PCT/IE03/00129 Sep. 24, 2003, which claims benefit of U.S. Provisional Application No. 60/414,166 Sep. 27, 2002.

FIELD OF THE INVENTION

This invention relates to a digitally compensated signal converter method and system with anti-function correction, in particular to digital to analog converters. The invention also extends to analog to digital converters.

BACKGROUND OF THE INVENTION

Converters, for example digital to analog converters (DAC's), can be calibrated to correct linearity errors through mixed-signal analog solutions with correction DACs to compensate for random and systematic errors. In that approach the output of the primary DAC is compared with a reference or ideal output. A difference between the two results in a signal being delivered to a correction DAC to cause it's output to drive the difference toward zero. While this approach effects a reduction of the error, it introduces other shortcomings. It requires a mixed signal solution using analog and digital components which add to the complexity. Further, the two DACs must be closely monitored so that conditions will affect both DAC's similarly e.g. both have the same changes in response to a change in temperature. It also results in a larger system due to interconnects and partitioning of the design. The same problems exist for analog to digital converters (ADC's).

One typical prior art system for compensating for digital to analog converter errors is shown in FIG. 9, where the primary DAC 90 is accompanied by a correction DAC 92, a comparator 94, summing circuit 96 and SAR (Successive Approximation Register) logic 98. In operation, the output of DAC 90 is compared to an ideal reference by comparator 94. The SAR logic provides an input to correction DAC 92 drive summing circuit 96 to minimize the difference sensed by comparator 94. The output of DAC 92 is summed with the output of DAC 90 in summer 96 and delivered back to comparator 94. As indicated earlier in the background one of the problems with this approach is that DACs 92 and 90 must be matched so that they respond similarly to the same conditions, e.g. process, voltage, temperature (PVT). In addition there is the expense and complexity of the added DAC and its associated circuitry. This also employs a mixed signal approach which increases complexity and cost.

U.S. Pat. No. 6,292,125 discloses a system and method for digital-to-analog conversion which provides an accurate and reliable digital-to-analog conversion. The system discloses a DAC comprising a plurality of analog weight having associated digital sizes. The conversion works by receiving a binary input, searching for selected weights from the analog weights, which has an associated digital size, then outputs a sum of the selected analog weights. A problem with this U.S. patent is that the architecture is constrained by using elements of differing weights. Using different sizes is widely known as a bad practice, to those skilled in the art, for matching purposes. This constraint results in degradation of second order effects e.g. temperature & voltage coefficient mismatch, which are also important on high performance designs. There may also be a large memory requirement to store weights for each element and this is especially true for architectures with many contributing elements e.g. string DACs with $2^N$ elements or as that disclosed in another document U.S. Pat. No. 5,969,657 which makes the weight table of the converter excessively large and complex. The mapping of the weights also becomes more complex.

Another U.S. Pat. No. 6,456,112 discloses a system for calibrating data converters which uses pre-digital error correction codes, which directly reflect the behaviour of each stage of an analog to digital converter. The system operates by providing one or more pre-digital error correction codes from the input signal which are compared to transition voltage expressions by using a 0 or 1 output to improve the accuracy and calibration of the analog to the digital converter. However a problem with this patent is that the error codes do not represent the complete error in the signal. Furthermore this system is specifically directed to compensating the error on the output digital signal of an analog to digital converter.

OBJECT OF THE INVENTION

It is therefore an object of this invention to provide an improved digitally compensated digital to analog converter (DAC) system and method with anti-function calibration. The invention also aims to provide an improved digitally compensated analog to digital converter (ADC) system and method with anti-function calibration.

It is a further object of this invention to provide to such an improved digitally compensated digital to analog converter (DAC) system and method to correct the error function wholly digitally.

It is a further object of this invention to provide such an improved, digitally compensated digital to analog converter (DAC) system and method which is less expensive, requires less interconnect elements and analog components and dramatically reduces the need for matching components to avoid errors due to diverse component responses to changing conditions.

It is a further object of this invention to provide such an improved digitally compensated digital to analog converter (DAC) system and method which eliminates the need for additional correction DACs and the attendant need to match characters of the correction DAC and primary DAC to compensate for changes in temperature or other conditions.

It is a further object of this invention to provide such an improved digitally compensated digital to analog converter (DAC) system that can be integrated as a single unit, minimizing the design sensitivity to topological effects such as wafer fabrication processing gradients and package stress effects and is more robust to connectivity sensitivities.

It is further object of this invention to provide an improved digitally compensated signal converter system and method with anti-function calibration.

SUMMARY OF THE INVENTION

The present invention, as set out in the appended claims, features a digitally compensated digital to analog converter system including a digital to analog converter and a storage device for storing the anti-function digital coefficients corresponding to the error function of the digital to analog converter. An anti-function processor applies the anti-function digital coefficients to the digital input to the digital to analog converter to digitally compensate for the error function of the digital to analog converter.

The invention results from the realisation that a less complex, in an analog sense, more robust compensation of a digital to analog converter may be effected by applying to the digital input to the DAC anti-function digital processor to precondition the digital input to compensate for the error function of the DAC and the further realisation that those digital coefficients can be generated by measuring the output of the DAC with known inputs, determining the error function of the DAC from the measured outputs, and combining the error function with a suitable mathematical expression to generate the anti-function digital coefficients. A variety of digitised basis functions can be used to create the anti-(error) function for compensating for DAC transfer function errors. There are a large variety of digitised basis functions known in the art of mathematics or which can be derived from mathematical textbooks, for example 'Linear System Theory', W. J. Rugh, $2^{nd}$ Edition, Prentice Hall 1996.

Heretofore, no system or method relies on the fact the error of a digital signal can be wholly represented by using a single digital basis function to generate digital anti-function co-efficient to precondition the digital signal before the digital signal enters the DAC for conversion. Orthogonal basis functions can be used to describe signals and one of the most commonly used orthogonal basis functions is Fourier series and the Fourier transform and Fast Fourier Transform (FFT) techniques are in ubiquitous use for real-world time/frequency domain signal analysis. For digital signals Radamacher functions or Walsh functions are more applicable. The digital basis functions used and described in this application are non time-based basis functions, e.g. non-FFT, but specifically relate to the converter transfer function i.e. the analog converter signal level vs. the converter code.

In a preferred embodiment, there may be a anti-function coefficient generator system for generating the anti-function digital coefficients. The anti-function coefficient generator system may include an anti-function coefficient generator and a switching device to interconnect the digital anti-function processor with a digital to analog converter in a correction mode and interconnect the anti-function coefficient generator with the digital to analog converter in a calibration mode. The anti-function coefficient generator system may include an analog to digital converter with its input connected to the output of the digital to analog converter and the anti-function generator for delivering in the calibration mode selected codes through the switching device to the digital to analog converter and receiving from the analog to the digital converter a digital representation of the analog output for the digital to analog converter. The anti-function generator system may include a storage device for storing generated anti-function digital coefficients. The anti-function generator system may include a microprocessor.

In one embodiment, it is preferable that the digital basis function is a transfer function having multi section output levels. In other embodiments the basis function is a linear transfer function or orthogonal basis function. Ideally the anti-function coefficients are provided by an analog to digital converter measuring an analog level coupled to the output of said digital to analog converter to generate a digital signal supplied to said anti-function coefficient generator.

In one embodiment the anti-function generator comprises an Arithmetic Logic Unit (ALU) and control logic with means to implement multiple digital basis functions to provide said anti-function digital coefficients and an optional storage device having anti-function coefficient memory. The control logic comprises means for providing control signals to said anti-function coefficient generator and to a strobe signal to said analog to digital converter.

In another embodiment the system comprises means for said calibration mode to be re-run a number of times to reduce errors during said correction mode.

Another aspect of the present invention provides a digitally compensated analog to digital converter system comprising an analog to digital converter, a storage device for storing anti-function digital coefficients corresponding to an error function of the analog to digital converter and an anti-function processor for applying generated anti-function digital coefficients to the digital output of the analog to digital converter for digitally compensating for the error function of the analog to digital converter.

In a further aspect of the present invention, there is provided a digitally compensated signal converter system comprising a signal converter, a storage device for storing anti-function digital coefficients corresponding to an error function of the signal converter and an anti-function processor for applying generated anti-function digital coefficients to a digital signal of the signal converter for digitally compensating for the error function of the signal converter.

The invention also features a method of digitally compensating a digital to analog converter including receiving digital input data for a digital to analog converter and supplying anti-function digital coefficients derived from the error function of the digital to analog converter and corresponding to the digital input data. The anti-function digital coefficients are applied to the digital input data to precondition the digital input data to compensate for the error function of the digital to analog converter. The supplying of the anti-function digital coefficients may include generating the error function. Generating the error function may include providing a digital input code to the digital to analog converter measuring the corresponding output of the digital to analog converter and substantially calculating the error function from the measured output of the digital to analog converter. Supplying the anti-function digital coefficients may include selecting a digital basis function, calculating from the basis function and the error function at least one anti-function digital coefficient corresponding to the provided digital input code.

The invention also features a method of generating anti-function digital coefficients for a digital to analog converter including selecting a digital basis function and providing a digital input code to the digital to analog converter. The output of the digital to analog converter corresponding to the input code is measured. The error function of the digital to analog converter is substantially calculated from the measured output and from the error function and the digital basis function are calculated from the anti-function digital coefficients.

The invention further features a digitally compensated digital to analog converter system including a digital to analog converter and an anti-function coefficient generator system for calculating the anti-function digital coefficients corresponding to the error function of the digital to analog converter. There is an anti-function processor for applying the anti-function digital coefficients to the digital input to the digital to analog converter for digitally compensating for the error function of the digital to analog converter.

In a preferred embodiment the anti-function coefficient generator system may include an anti-function coefficient generator and a switching device for interconnecting the digital anti-function processor with the digital to analog converter in a correction mode and interconnecting the anti-function coefficients generator with the digital to analog converter in a calibration mode. The anti-function coefficient generator system may include an analog to digital converter with its input connected to the output of the digital to analog converter and the anti-function generator delivers in the calibration mode selected codes to the switching device to the digital to analog converter and receives from the analog to digital converter a detailed representation of the analog output from the digital to analog converter. The anti-function generator system may include a microprocessor.

The invention further provides a method of digitally compensating an analog to digital converter comprising the steps of, receiving digital signal data for an analog to digital converter, supplying anti-function digital coefficients derived from the error function of the analog to digital converter corresponding to the digital signal data and applying the anti-function digital coefficients to said digital input data to precondition said digital input data to compensate for the error function of said analog to digital converter.

In yet another aspect of the present invention there is provided a method of digitally compensating a signal converter comprising, receiving digital signal data for a signal converter, supplying anti-function digital coefficients derived from the error function of the signal converter corresponding to the digital signal data, and applying the anti-function digital coefficients to said digital signal data to precondition said digital signal data to compensate for the error function of said signal converter The invention also provides a computer program comprising program instructions for causing a computer program to carry out at least one or all of the steps of the above method, which may be embodied on a record medium, carrier signal or read-only memory.

BRIEF DESCRIPTION OF THE DRAWINGS

Other objects, features and advantages will occur to those skilled in the art from the following description of a preferred embodiment and the accompanying drawings, in which:

FIG. 8 is a schematic block diagram of an anti-function generator for generating the corrective anti-function digital coefficients; and FIG. 9 is a block diagram of a prior art circuit using a correction DAC to correct a primary DAC;

DETAILED DESCRIPTION OF THE DRAWINGS

Figure 1:
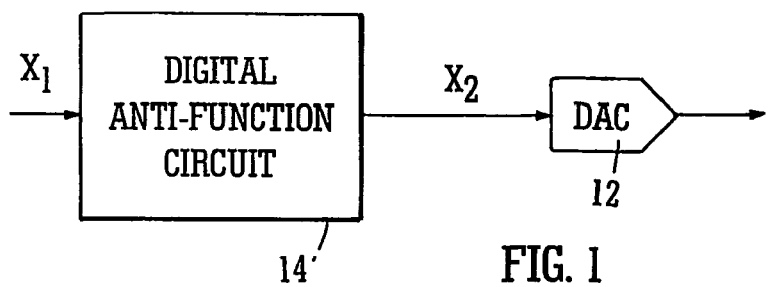
FIG. 1 is a simplified block diagram of a digitally compensated digital to analog converter system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. Furthermore, for the sake of clarity, the invention is described in detail for an embodiment of digitally compensating a digital input to a DAC only. It will be appreciated that the invention can be employed on the output digital signal of a conventional analog to digital converter in an inverse manner as for the DAC. In both cases the error function can be compensated by digital compensation of the digital converter signal.

There is shown in FIG. 1, a digitally compensated digital to analog (DAC) converter system 10 according to this invention including a digital to analog converter 12 with a transfer function (not shown) to be compensated and a digital anti-function circuit 14 which intercepts the digital input $X_1$ to DAC 12 and preconditions it before delivering it as input $X_2$ to DAC 12 to compensate for an error function of DAC 12. The transfer function of the DAC system 10 is thus substantially the desired transfer function in order for the DAC 12. In measuring and compensating for the DAC error via digital calibration, errors in the DAC reference path and any additional error sources between the DAC output and the chosen ADC sense point can be included in the calibration. This enables the DAC calibration to absorb and compensate the associated error sources.

The anti-function circuit 14 serves to digitally apply a compensating transfer function to substantially reduce or remove the error function of the digital to analog converter using a digital, quantised basis function. The anti-function coefficient generator of the present invention is a system design to measure the analog signal error function, substantially calculate the quantised inverse function of the DAC 12 error function using a basis function and store the resultant coefficients.

Figure 2:
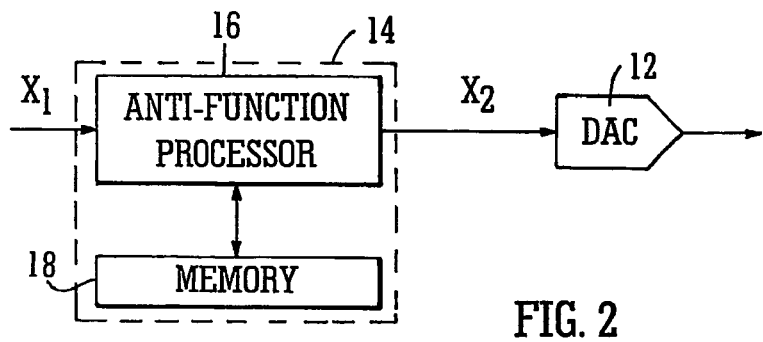
FIG. 2 is a more detailed block diagram of the digital anti-function circuit of FIG. 1.

Digital anti-function circuit 14 may include an anti-function processor 16, FIG. 2, and a memory 18. Memory 18 or other storage device stores the anti-function digital coefficients corresponding to the error function of the digital to analog converter 12. Anti-function processor 16 utilizes the anti-function digital coefficients in storage or memory 18 to the digital analog converter 12 in order to digitally compensate for the error function of the digital to analog converter 12.

Figure 3A:
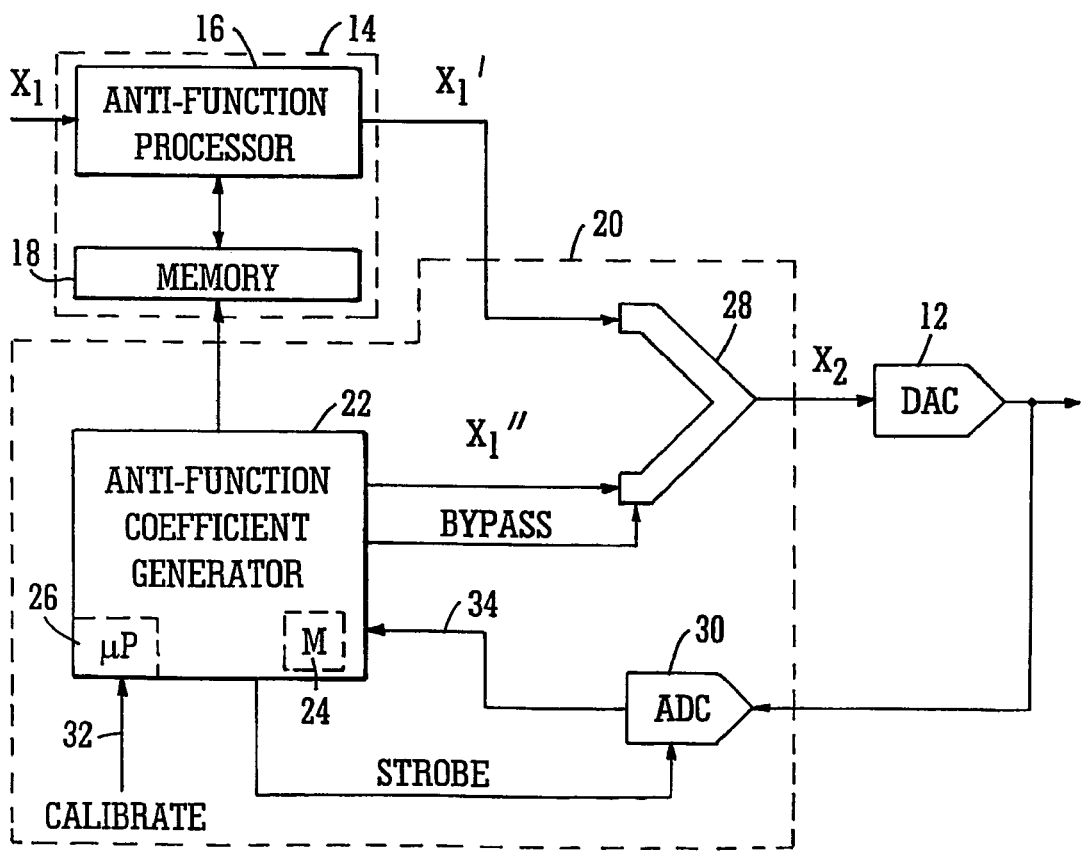
FIG. 3A is a more comprehensive block diagram which shows the anti-function coefficient generator system in addition to the digital anti-function circuit of FIG. 2.

Also included is an anti-function coefficient generator system 20, as illustrated in FIG. 3A, which includes an anti-function coefficient generator 22 including a storage device, such as memory 24, and a micro-processor 26. There is a switching circuit 28 and an analog to digital converter 30. In the correction mode switch 28 delivers the output $X'_1$ of anti-function processor 16 to the input of DAC 12. As previously explained anti-function processor 16 uses the anti-function digital coefficients stored in storage or memory 18. These are obtained in the calibrate mode when a calibrate signal is delivered on line 32, the calibration mode is involved to anti-function generator 22 a bypass signal on line 34 causes switch 28 to cease providing the input $X'_1$ from anti-function processor 16 to DAC 12 and instead provides the output $X''_1$. At this time anti-function coefficient generator 22 will provide a digital code through switch 28 to DAC 12; the analog output of DAC 12 is measured by analog to digital converter 30 and the digital signal is provided on line 34 to anti-function coefficient generator 22. Here the measured output of DAC 12 is compared with the ideal output and error function coefficients are generated either at this time or when all of the codes and measurements have been taken. The anti-function coefficient generator 22 calculates from the error function(s) stored in storage 24 the anti-function digital coefficients and provides them through anti-function processor 16 to be stored in memory 18. When the calibrate signal is removed switch 28 is then enabled to apply the $X'_1$ output from anti-function processor 16 directly to DAC 12.

Figure 3B:
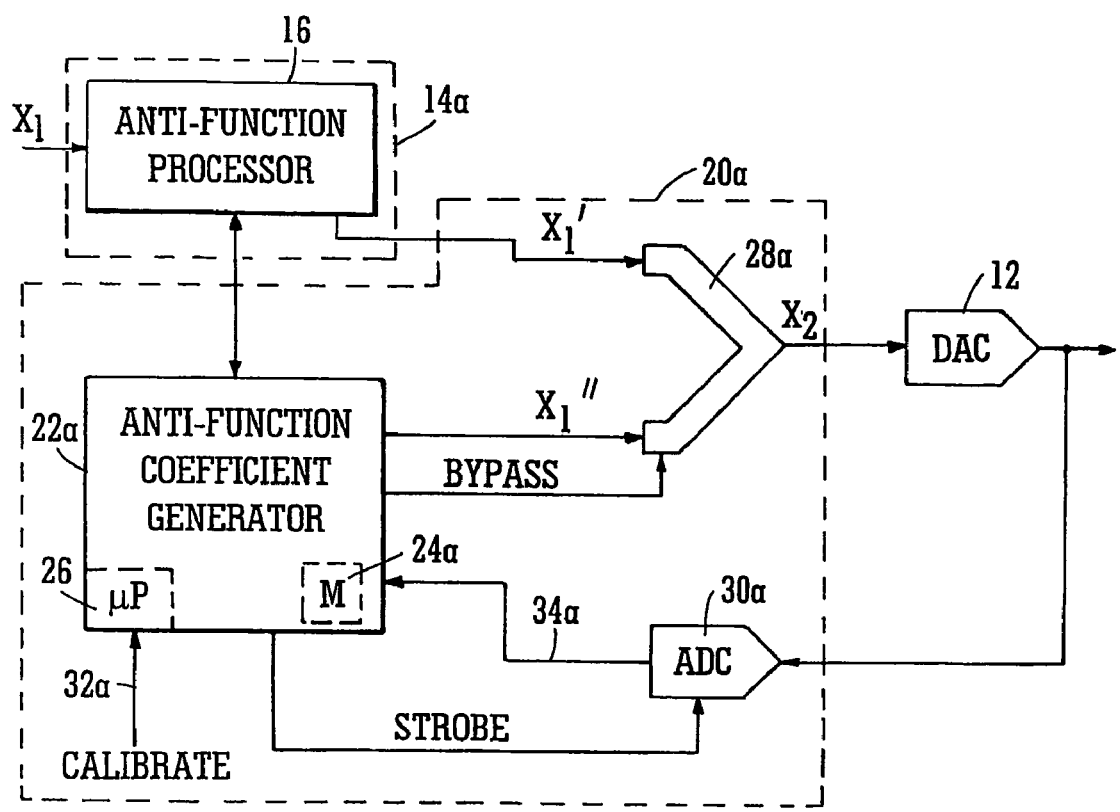
FIG. 3B is a block diagram of an alternative construction of the digital anti-function circuit and anti-function coefficient generator system of FIG. 3A.

While in FIG. 3A, the anti-function digital coefficients are stored in storage or memory 18 and applied as necessary by anti-function processor 16 this is not a necessary limitation of the invention, for example, as shown in FIG. 3B, the anti-function digital coefficients may be generated by anti-function coefficient generator 22a, FIG. 3B, as needed and supplied directly to anti-function processor 16 upon request. In that case, typically, storage 24a would store not the measured values of the DAC 12 output but rather the error function for those measured values, which have been calculated and stored in storage 24a. When requested and identified by code any one or more of those error function coefficients will be retrieved and combined with the basis function to substantially calculate the anti-function digital coefficients. Instead of the error function the raw data from the measured output of DAC 12 may be stored in storage 24a, in which case, a first calculation of the error function followed by calculation of the anti-function coefficient will have to be effected on an as needed basis. This approach shown in FIG. 3B, eliminates the need for large memory or storage 18 but requires a larger storage 24a in order to store the raw or measured data or alternatively the error function. It may also require a greater processing ability in order to calculate the coefficients each time a new request is made by anti-function processor 16.

Figure 3C:
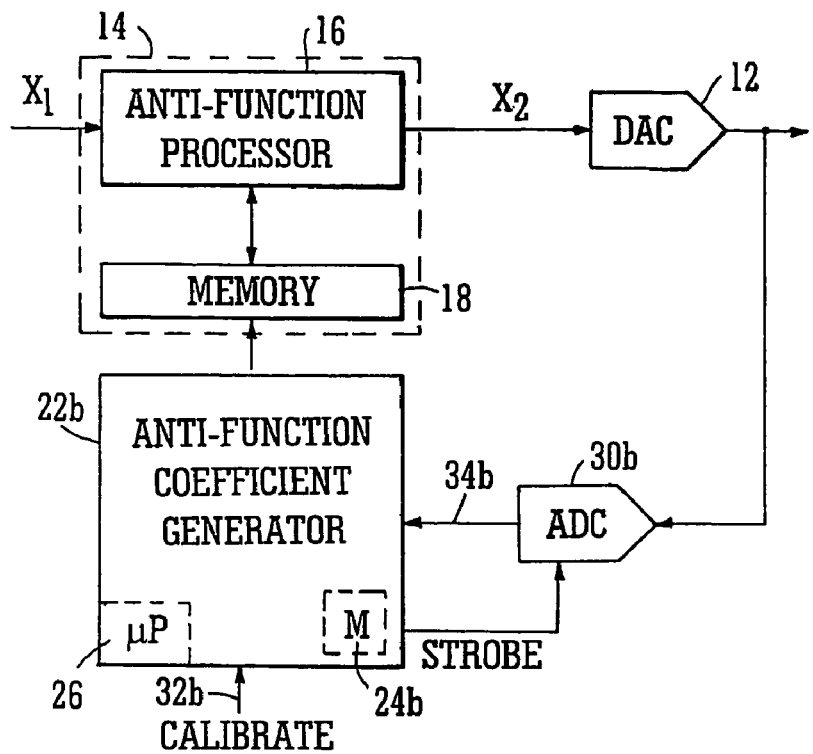
FIG. 3C is a block diagram is another construction of the digital anti-function circuit and anti-function coefficient generator system of FIG. 3A.
Figure 3D:
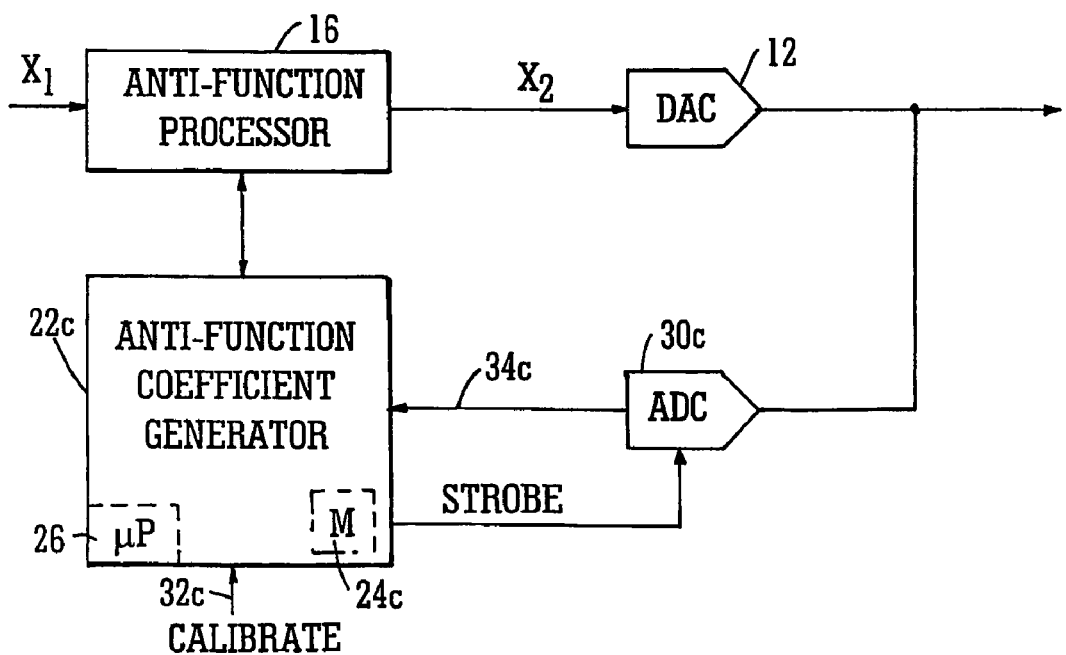
FIG. 3D is a block diagram of a further construction of the digital anti-function circuit and anti-function coefficient generator system of FIG. 3A

Referring now to FIGS. 3C and 3D illustrates alternative embodiments of the present invention. In these embodiments the anti-function calibration is carried out without the multiplexer 28. The anti-function generator 22b, 22c comprises the capability to write the output X2 by manipulating the anti-function coefficients. For example, there may be a set of coefficients which make X2=X1. In another example, X2 maybe controllable via the anti-function generator 22b, 22c to provide the required data to the DAC 12. While FIGS. 3A and 3B show systems where a switch or multiplexer 28 is needed to differentiate between calibration mode and correction mode, this is not necessary a limitation of the invention. The systems shown in FIGS. 3C and 3D use the anti-function generator 22b, 22c to provide a digital code to the DAC 12. The analog output of the DAC 12 is measured by the ADC 30b, 30c and the digital signal is provided to the anti-function coefficient generator 22b, 22c respectively.

While in FIG. 3C the anti-function digital coefficients are stored in a storage device 18, in FIG. 3D they are generated, as needed, by the anti-function coefficient generator 22c.

Figure 4:
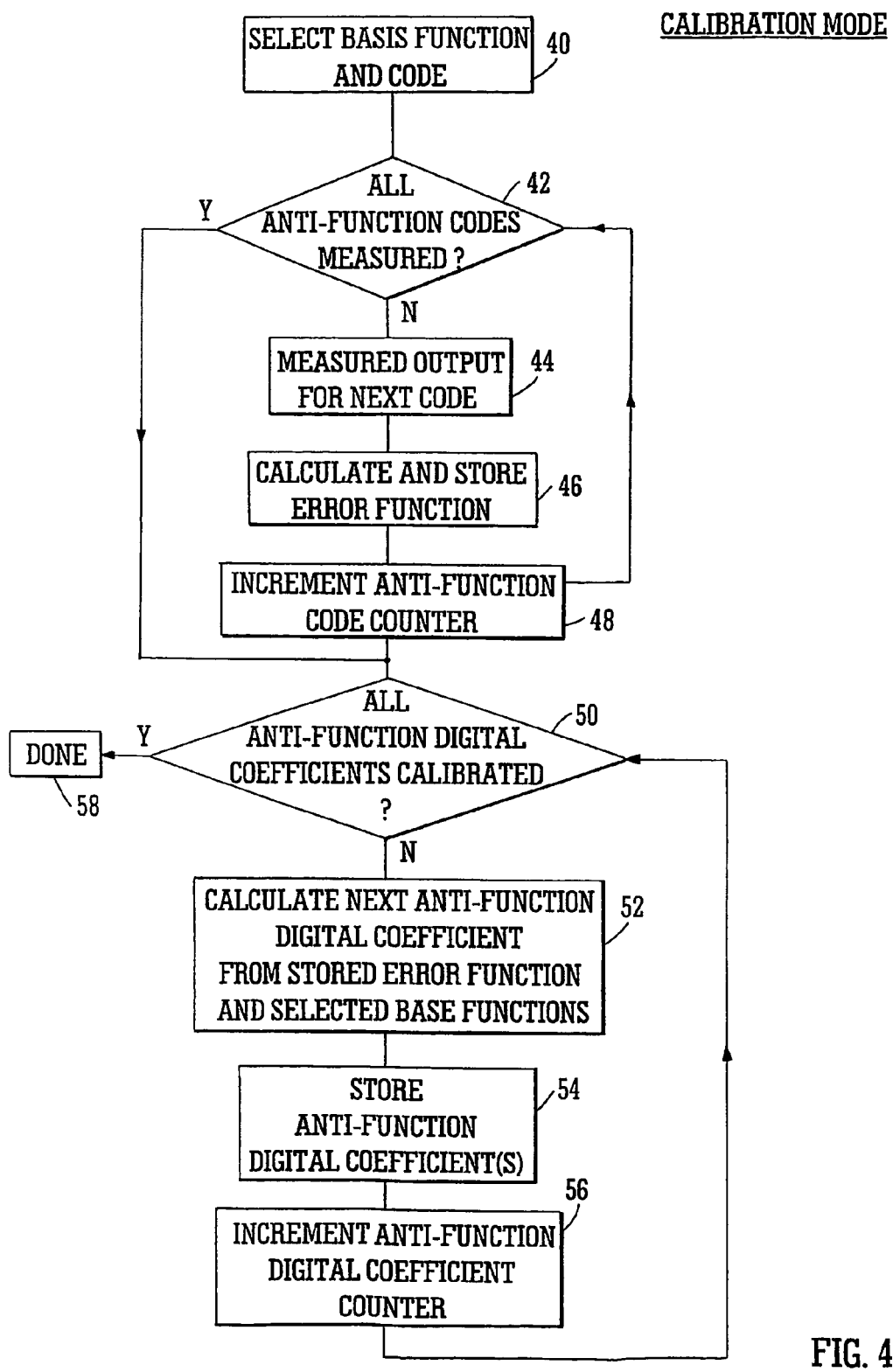
FIG. 4 is a flow chart of the method of calibrating to obtain the anti-function digital coefficients according to this invention.

The method of operation of the invention using the system of FIG. 3A involves two modes, a calibration mode and a correction mode. The calibration mode is shown in FIG. 4, where a basis function and code specifics are first selected in step 40 after which comparison is made as to whether all the anti-function codes have been measured in step 42. If they have not, the output of DAC 12 is measured after the next code 44 has been delivered to DAC 12 and sufficient settling time has been allowed and then the error function may be substantially calculated and stored as step 46. The anti-function code counter 48 is incremented in step 48 and the system returns again to step 42 or it continues until all of the anti-function codes have been measured. Following this the inquiry is made as to whether all the anti-function digital coefficients have been calculated in step 50. If they have not, then the next anti-function digital coefficient is calculated from the stored error function and the selected basis function in step 52. The anti-function digital coefficient is then stored in step 54 and the anti-function digital coefficient counter is incremented in step 56. This continues until all the anti-function digital coefficients are calculated at which point the system is done as indicated as 58. As indicated previously the error function need not be stored and the coefficients need not be calculated and stored ahead of time but rather may be done on an as needed basis as indicated in FIG. 3B.

Figure 5:
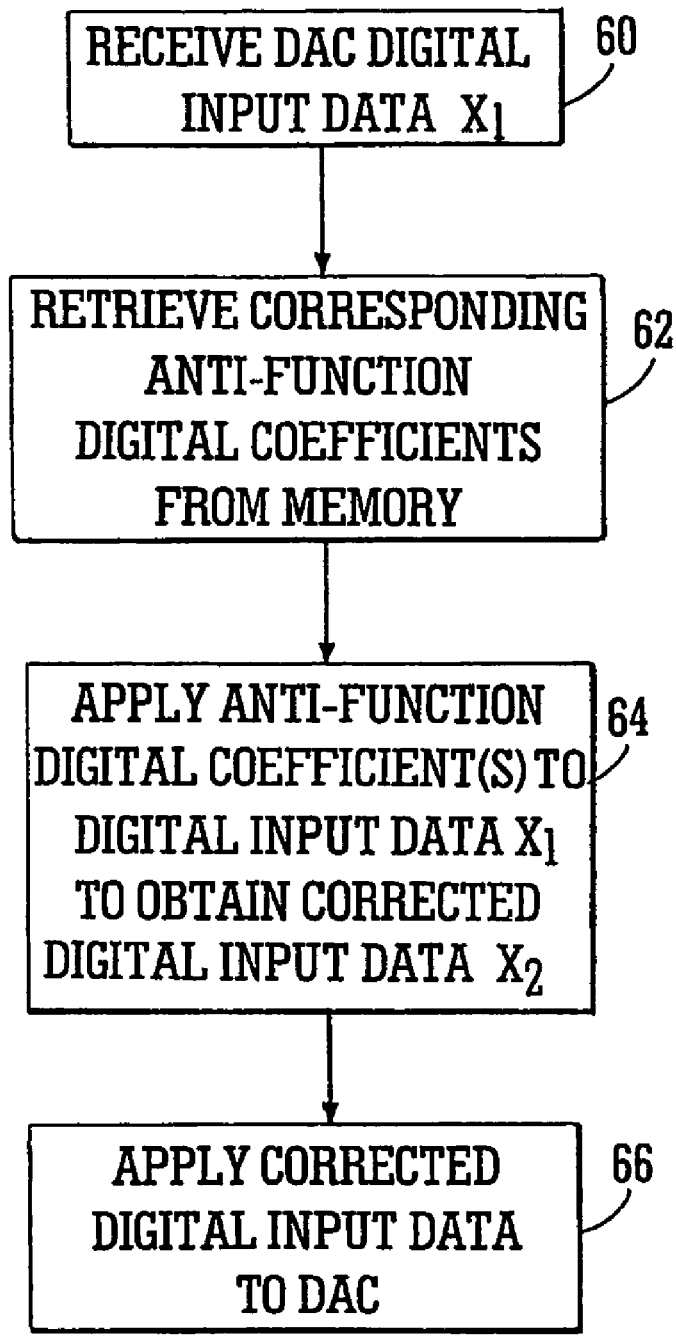
FIG. 5 is a flow chart of the method of correcting by applying the anti-function digital coefficients according to this invention.

In a correction mode, FIG. 5, the system receives the DAC digital input data, such as $X_1$ in step 60 and then retrieves the corresponding anti-function digital coefficients from memory in step 62. These anti-function digital coefficients are applied in step 64 to the digital input data $X_1$ to obtain the corrected digital input data $X_2$. The corrected digital input data is then applied in step 66 to the DAC. In this way the inputs of the DAC are preconditioned to compensate for the error function of the DAC.

Figure 6:
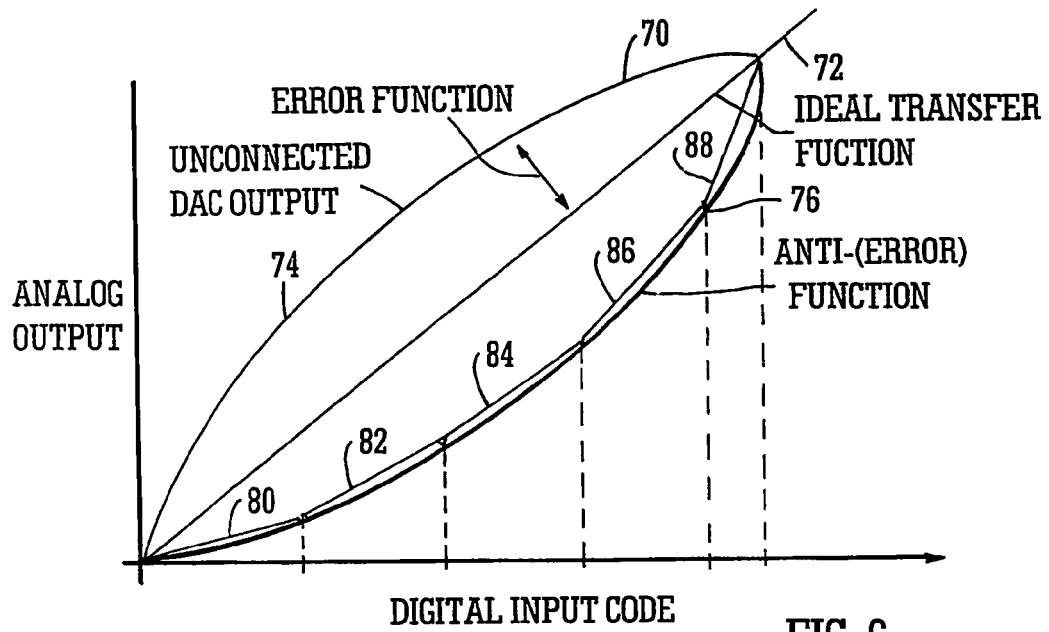
FIG. 6 is an illustration of an uncorrected DAC output transfer function, an ideal linear transfer function and the error and anti-function.

The different functions may be more readily understood by referring to FIG. 6, where the uncorrected DAC output 70 is plotted along with an ideal linear transfer function 72.

Alternative transfer functions maybe used, for example a logarithmic transfer function. A conventional linear transfer function, equation 1 which can be used in the DAC 12 is:

$$Y = n*[(V_{ref+} - V_{ref-})/2^N] + V_{ref-} \qquad \text{Eq. 1}$$

Where Y=DAC output level n=the DAC code

N=the resolution of the DAC

The difference between the two determines the error function 74. An anti-function or anti-error function 76 is generated to compensate for the error function 74 and result in the DAC's output more nearly approaching the ideal linear transfer function 72. Thus by pre-conditioning the input with the anti function 76 the error function is compensated for. The error function is generated using a digital basis function to approximate the necessary shape, for example, in FIG. 6, a five line approximation is used to illustrate the technique where in each line 80, 82, 84, 86, and 88 are sections of the output levels of sections of the transfer function which can be defined by a linear equation of the form y=mx+c. It will be appreciated from equation 1 above that the expression $[(V_{ref+}-V_{ref-})/2^N]$ represents the slope M which is multiplied by the DAC code.

Figure 7:
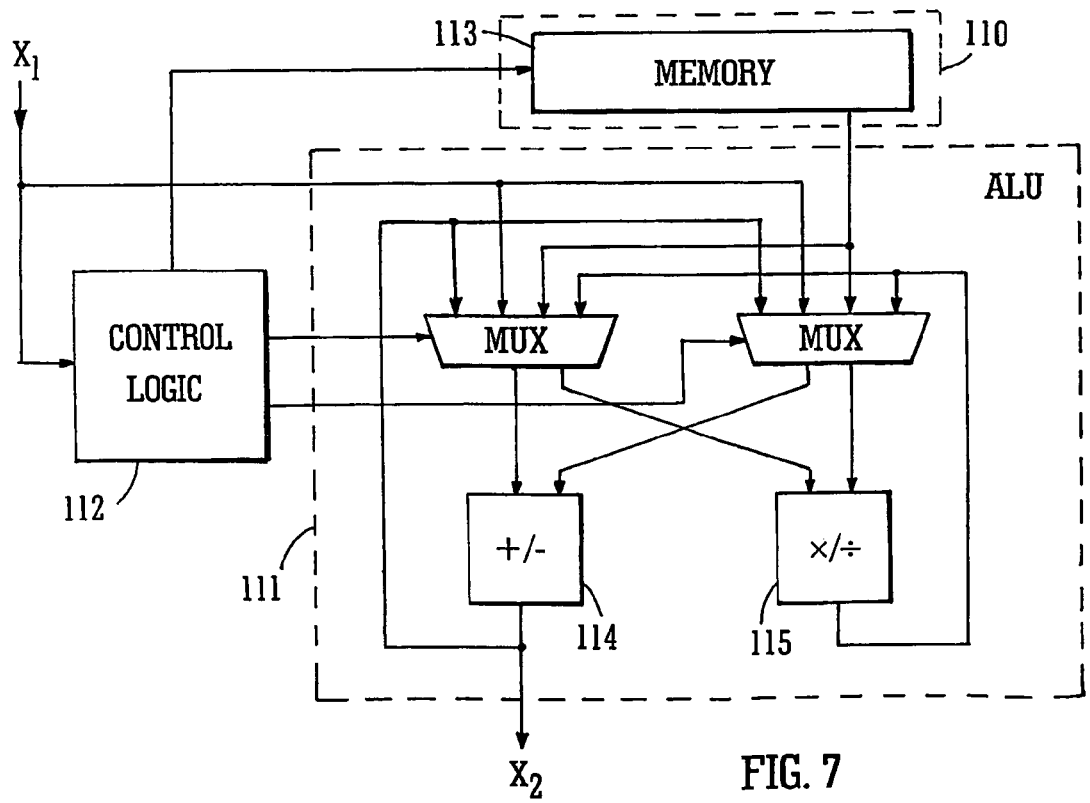
FIG. 7 is a schematic block diagram of an anti-function processor circuit for applying the corrective anti-function digital coefficients to recondition DAC digital input.

In FIG. 7 the block diagram of an implementation of the anti-function generator is indicated by the reference numeral 110. This implementation includes an Arithmetic Logic unit (ALU) 111, control logic 112 and an optional storage device or memory 113. The storage device 113 is optional, and if present, it could be the anti-function generation memory or the anti-function coefficient generator memory.

Those skilled in the art will appreciate that various implementations of the anti-function generator 110 are possible, depending on the basis function selected. The control logic 112 can be used to implement multiple functions. Serial and parallel arithmetic can be used, and the arithmetic operations may be made in parallel by including more basic arithmetic blocks (adders, subtractors, multipliers, dividers) depending on the operations required by the basis function. The output, x2, is shown as being generated by the adder/subtractor block 114, but it may also be generated by the multiplier/divider block 115.

In FIG. 8 the block diagram of an implementation of the anti-function coefficient generator is shown, indicated by the reference numeral 100. It includes an ALU 101, a control logic 102, a calibration codes memory block 103 and an optional memory 104. The control logic 102 provides the control signals for the other blocks and the strobe signal for the ADC 30, 30b, 30c. The blocks shown in FIG. 8 can be implemented by dedicated logic, in a similar fashion to FIG. 7, or by programming a general-purpose processor or digital signal processor (DSP).

In practice, electrical device noise and electromagnetic interference can cause errors to be introduced into the accuracy of the calibration step. In the implementation of FIG. 8 a calibration check can be used to monitor the accuracy of the calibration. Re-calibration can be initiated by providing a calibration loop defining a calibration cycle. The calibration cycle can be run a number of times to remove random or pseudo-errors, which can be stored in the calibration coefficients from a first calibration cycle. The resolutions of the outputs x1 versus x2 are a design variable. Using a larger converter resolution than is required allows converters to be calibrated more accurately i.e. resolution of x2 greater than resolution of x1 for DAC calibration and the inverse for ADCs.

Other basic functions which may be used to approximate the shape of the necessary anti-error function may include polynomial equations such as higher order polynomial equations.

Figure 10:
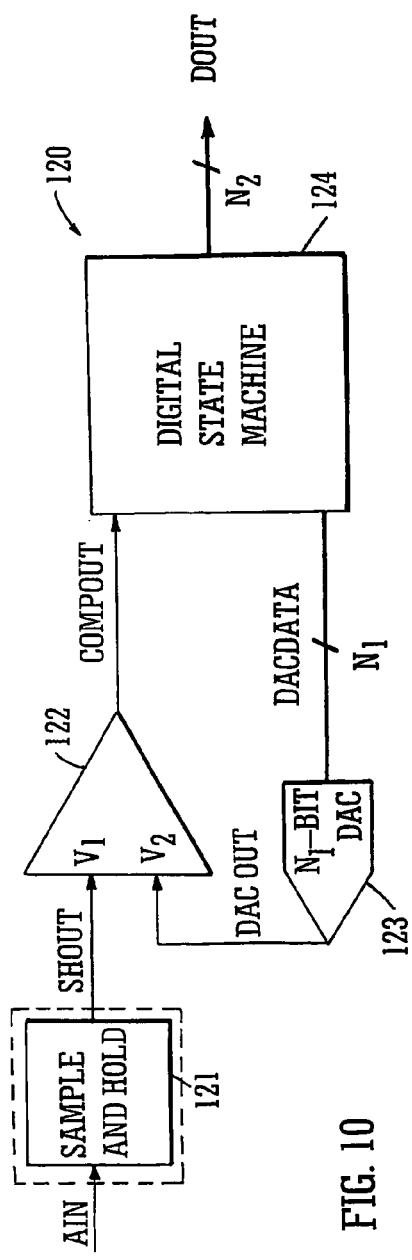
FIG. 10 is a block diagram of a single stage analog to digital converter (ADC)

An analog to digital converter (ADC) performs the inverse transfer function to a digital to analog converter (DAC). FIG. 10 shows a Single Stage ADC block diagram illustrated generally by the reference numeral 120 with a sample-and-hold circuit 121(not required, but conventionally used), a DAC function 123 and a digital state machine 124 which works to drive the DAC and use COMPOUT, obtained from a comparator 122, based decisions to decide the analog input signal level. The ADC digital output signal, DOUT, can be the same as the DAC input signal, DAC-DATA, and can also be different. They are most often the same if the DAC resolution N1 is the same as the ADC resolution, N2. Therefore, although both DACDATA and DOUT are shown on FIG. 10, only DACDATA may be required. Although there are many other forms of ADC architecture, e.g. Delta-sigma architectures, a DAC 123, a comparator function 122 and a digital state machine 124, however simple in construction, are common to all. Therefore, it will be appreciated by those skilled in the art that the ADC linearity transfer function errors are strongly correlated with errors in the DAC transfer function.

Figure 11:
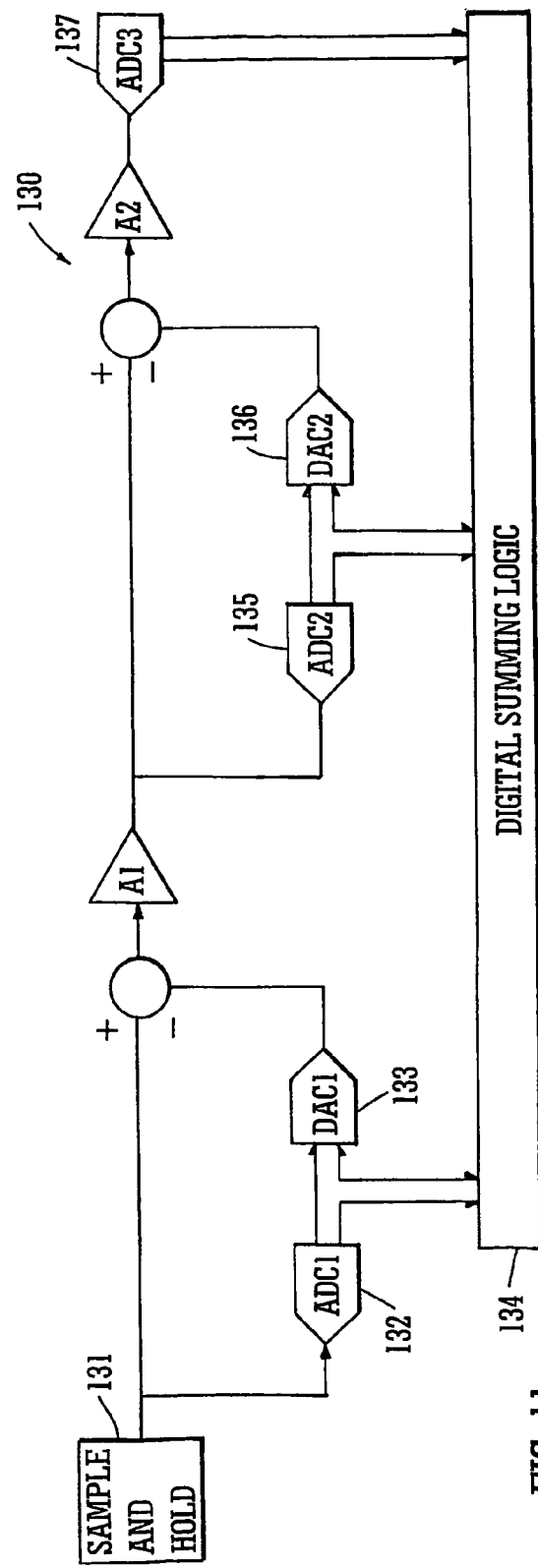
FIG. 11 is a block diagram of a typical multi-stage ADC architecture.

In another embodiment FIG. 11 illustrates a multi-stage ADC Block Diagram generally indicated by the reference numeral 130. Multi-stage ADC, e.g. pipeline or most Delta-Sigma ADC topologies also abound, operate using what are conventionally known as sub-converters 132, 133, 135, 136 and 137 to provide a number of stages in conjunction with a sample and hold circuit 131 and digital summing logic 134. The residue analog signal is passed from one stage to another for further conversion. The final converted output signal corresponds to the sum (possibly digital corrected or merged) version of the stages. The digital calibration system and method described is both architecture and circuit implementation independent, it can be used for single and multi-stage topologies. The ADC can also use digital transfer function calibration in a very similar, but inverse, method to a DAC to achieve the desired ADC system transfer function.

Figure 12:
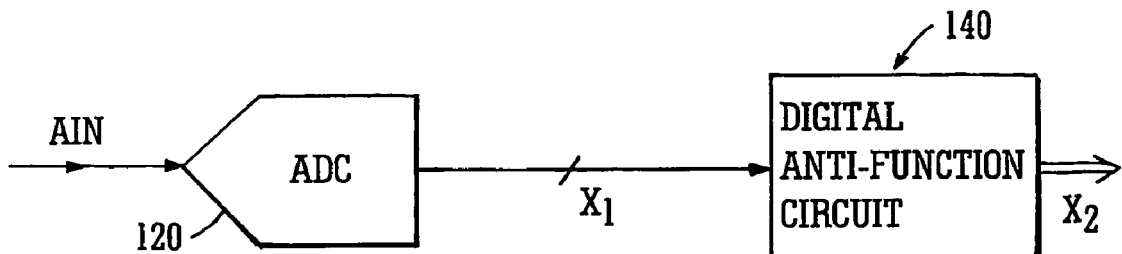
FIG. 12 is a simplified block diagram of a digitally compensated analog to digital converter system according to this invention.
Figure 13:
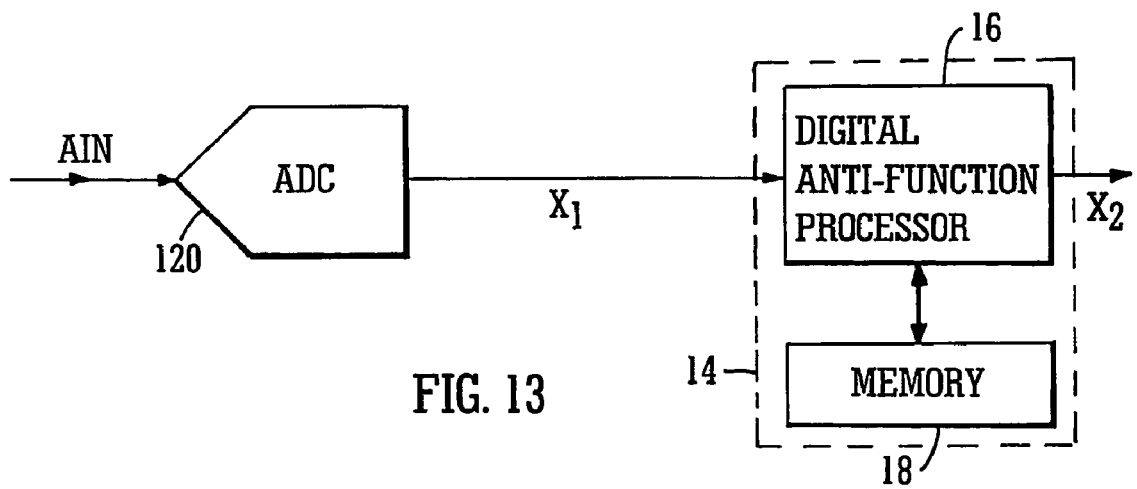
FIG. 13 is a more detailed block diagram of the digital anti-function circuit of FIG. 12.

FIGS. 12 and 13 shows a typical ADC 120 with digital anti-function correction circuit 14 illustrated generally by the reference numeral 140, which is essentially the inverse of the DAC equivalent of FIG. 1. The anti-function correction circuit comprises the digital anti-function processor 16 and optional memory 18 as described in the DAC embodiment. It will be appreciated that all of the subsidiary features for the DAC system and method described in detail above are equally applicable to the ADC system and method.

Figure 14:
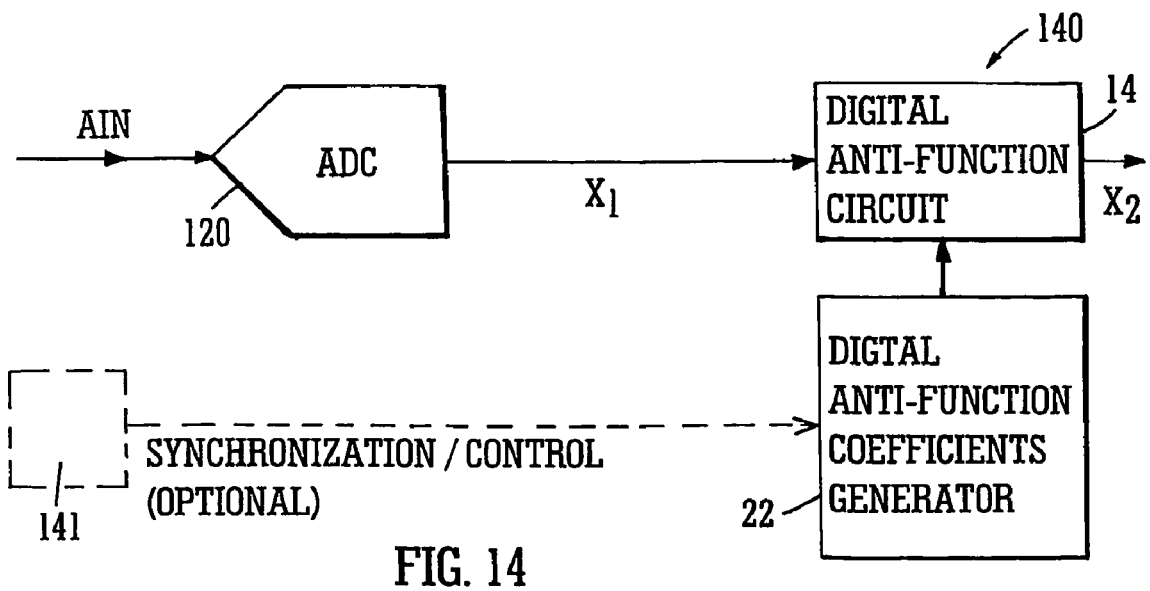
FIG. 14 is a more comprehensive block diagram which shows the anti-function coefficient generator system in addition to the digital anti-function circuit of FIG. 13.

FIG. 14 shows the ADC system 140 with digital anti-function correction. A known analog signal source is required to deliver an analog calibration signal to the ADC 120. A synchronization/control signal, shown with a dotted line 141, may be required to update the digital at the appropriate time. This synchronization may not be required if they are independently timed off a common synchronization source e.g. a reference clock. As with DAC calibration mode, the anti-function co-efficient generator 22 can calculate the error function versus the required transfer function. It is notable that the transfer function is definable by the analog signal for the ADC, which can be used deliberately to calibrate a non-linear TF, if desired. Analog signal accuracy is a calibration limit and electrical e.g. thermal, gaussian or white noise and non-electrical noise e.g. Electro-Magnetic Interference (EMI) are key concerns. The transfer function (TF) of the ADC 120 can be digitally compensated to substantially achieve the desired transfer function, within the resolution and range of a particular design, using this system and technique. It will be appreciated that the transfer function and conversion noise of the ADC 120 used to measure the required output level for DAC anti-function calibration needs to be quantified and understood in order to establish the calibration which will be achieved in a particular system embodiment.

The embodiments in the invention described with reference to the drawings comprise a computer apparatus and/or processes performed in a computer apparatus. For example the generation of the anti-function digital coefficients can be carried out by a digital signal processor (DSP) engine, micro-controller, or digital state machine (depending on the application), connected to a memory. Instructions to generate parameters for the anti-function coefficients are stored on the memory, for example on an EEPROM. A logic implementation of the function for the DSP engine can be supplied or programmed depending on the application required. The invention also extends to computer programs, particularly computer programs to carry out the instructions are stored on or in a carrier adapted to bring the invention into practice, for example C++. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims.

The invention claimed is:

1. A digitally compensated digital to analog converter system comprising:
    a digital to analog converter;
    a storage device for storing anti-function digital coefficients corresponding to an error function of the digital to analog converter; and
    an anti-function processor for applying generated anti-function digital coefficients to the digital input of the digital to analog converter for digitally compensating for the error function of the digital to analog converter, said anti-function digital coefficients providing non-linear error compensation.

2. The digitally compensated digital to analog converter system of claim 1 further including an anti-function coefficient generator system for generating said anti-function digital coefficients.

3. The digitally compensated digital to analog converter system of claim 1 or 2 wherein said anti-function coefficients are provided by an analog to digital converter measuring an analog output of said digital to analog converter to generate a digital signal supplied to said anti-function coefficient generator.

4. The digitally compensated digital to analog converter system of claim 2 in which said anti-function coefficient generator system includes an analog to digital converter with its input connected to the output of said digital to analog converter and said anti-function generator for delivering in, a calibration mode, selected codes through a switching device to said digital to analog converter and receiving from the analog to digital converter a digital representation of the analog output, from said digital to analog converter.

5. The digitally compensated digital to analog converter system of claim 4 in which said anti-function generator comprises an Arithmetic Logic Unit (ALU) and control logic with means to implement multiple digital basis functions to provide said anti-function digital coefficients.

6. The digitally compensated digital to analog converter system of claim 5 wherein said anti-function generator further comprises an optional storage device having anti-function coefficient memory.

7. The digitally compensated digital to analog converter system of claim 5 wherein said control logic comprises means for providing control signals to said anti-function coefficient generator and to a strobe signal to said analog to digital converter.

8. The digitally compensated digital to analog converter system of claim 2 in which said anti-function coefficient generator system includes an anti-function coefficient generator and a switching device for interconnecting said digital anti-function processor with said digital to analog converter in a correction mode and interconnecting said anti-function coefficient generator with said digital to analog converter in a calibration mode.

9. The digitally compensated digital to analog converter system of claim 8 in which said anti-function generator system includes a storage device for storing the generated anti-function digital coefficients.

10. The digitally compensated digital to analog converter system of claim 8 in which said anti-function generator system includes a microprocessor.

11. The digitally compensated digital to analog converter system of claim 8 wherein said system comprises means for said calibration mode to be re-run a number of times to reduce errors during said correction mode.

12. The digitally compensated digital to analog converter system of claim 1 in which the anti-function digital coefficients are generated from the error function of the digital to analog converter corresponding to the digital input data.

13. The digitally compensated digital to analog converter system of claim 12 in which the error function and a digital basis function are used to calculate the anti-function digital coefficients.

14. The digitally compensated digital to analog converter system of claim 13 in which the digital basis function is a transfer function having multi section output levels.

15. The digitally compensated digital to analog converter system of claim 13 in which the basis function is a linear transfer function.

16. The digitally compensated digital to analog converter system of claim 13 in which the digital basis function is an orthogonal basis function.

17. A digitally compensated digital to analog converter system comprising:
    a digital to analog converter;
    an anti-function coefficient generator system for generating anti-function digital coefficients corresponding to the error function of the digital to analog converter; and
    an anti-function processor for applying the anti-function digital coefficients to the digital input to the digital to analog converter for digitally compensating for the error function of the digital to analog converter, said anti-function digital coefficients providing non-linear error compensation.

18. The digitally compensated digital to analog converter system of claim 17 in which said anti-function coefficient generator system includes an anti-function coefficient generator and a switching device for interconnecting said digital anti-function processor with said digital to analog converter in a correction mode and interconnecting said anti-function coefficient generator with said digital to analog converter in a calibration mode.

19. The digitally compensated digital to analog converter system of claim 18 in which said anti-function coefficient generator system includes an analog to digital converter with its input connected to the output of said digital to analog converter and said anti-function generator for delivering in said calibration mode selected codes through said switching device to said digital to analog converter and receiving from the analog to digital converter a digital representation of the analog output, from said digital to analog converter.

20. The digitally compensated digital to analog converter system of claim 19 in which said anti-function generator system includes a microprocessor.

21. A digitally compensated analog to digital converter system comprising:
an analog to digital converter;
a storage device for storing anti-function digital coefficients corresponding to an error function of the analog to digital converter; and
an anti-function processor for applying generated anti-function digital coefficients to the digital output of the analog to digital converter for digitally compensating for the error function of the analog to digital converter, said anti-function digital coefficients providing non-linear error compensation.

22. A digitally compensated signal converter system comprising:
a signal converter;
a storage device for storing anti-function digital coefficients corresponding to an error function of the signal converter; and
an anti-function processor for applying generated anti-function digital coefficients to a digital signal of the signal converter for digitally compensating for the error function of the signal converter, said anti-function digital coefficients providing non-linear error compensation.

23. A method of digitally compensating a digital to analog converter comprising:
receiving digital input data for a digital to analog converter;
supplying anti-function digital coefficients derived from the error function of the digital to analog converter corresponding to the digital input data; and
applying the anti-function digital coefficients to said digital input data to precondition said digital input data to compensate for the error function of said digital to analog converter, said anti-function digital coefficients providing non-linear error compensation.

24. The method of claim 23 in which supplying anti-function digital coefficients includes generating said error function.

25. The method of claim 23 in which generating said error function includes providing a digital input code to said digital to analog converter, measuring the corresponding output of said digital to analog converter and calculating said error function from said measured output of said digital to analog converter.

26. The method of claim 23 in which supplying anti-function digital coefficients includes selecting a digital basis function from a plurality of digital basis functions, and calculating from said selected digital basis function and said error function the anti-function digital coefficient corresponding to the provided digital output code.

27. The method of claim 23 comprising the further step of storing said anti-digital coefficients in a storage device.

28. The method of claim 23 comprising the further steps of: measuring an analog output of said digital to analog converter; providing an analog to digital converter to generate a digital signal from said analog output; and supplying said digital signal to an anti-function coefficient generator.

29. A method as claimed in claim 28 comprising the step of providing calibrated control signals to said anti-function coefficient generator and to a strobe signal to said analog to digital converter.

30. A method as claimed claim 29 comprising the additional step of using said calibrated control signals in a calibration mode in a calibration loop defining a calibration cycle, wherein said calibration cycle is run at least once.

31. A method of generating anti-function digital coefficients for a digital to analog converter comprising:
selecting a digital basis function from a plurality of digital basis functions;
providing a digital input code to the digital to analog converter;
measuring the output of the digital to analog converter corresponding to that input code;
calculating from the measured output the error function of the digital to analog converter; and
calculating from the error function and the selected digital basis function the anti-function digital coefficients.

32. A method of digitally compensating an analog to digital converter comprising:
receiving analog to digital converter digital signal data;
supplying anti-function digital coefficients derived from the error function of the analog to digital converter corresponding to the digital signal data; and
applying the anti-function digital coefficients to said digital input data to precondition said digital input data to compensate for the error function of said analog to digital converter, said anti-function digital coefficients providing non-linear error compensation.

33. A method of digitally compensating a signal converter comprising:
receiving digital signal data for a signal converter;
supplying anti-function digital coefficients derived from the error function of the signal converter corresponding to the digital signal data; and
applying the anti-function digital coefficients to said digital signal data to precondition said digital signal data to compensate for the error function of said signal converter, said anti-function digital coefficients providing non-linear error compensation.

34. A computer program stored on a computer readable medium, the computer program comprising program instructions for causing a computer to perform the method of any one of claims 23, 31, 32 or 33.

35. A computer program as claimed in claim 34 stored on a record medium.

36. A computer program as claimed in claim 34 stored on a read-only memory.

* * * * *